(12) United States Patent
Tani et al.

(10) Patent No.: US 6,300,891 B1
(45) Date of Patent: Oct. 9, 2001

(54) D/A CONVERSION APPARATUS

(75) Inventors: Yasunori Tani, Osaka; Yoshinori Miyada, Kyoto; Kazuyuki Hyobu, Matsubara, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/266,601

(22) Filed: Mar. 11, 1999

(51) Int. Cl.$^7$ ........................................... H03M 1/66
(52) U.S. Cl. .............................. 341/144; 341/143
(58) Field of Search .................. 341/143, 144, 341/111

(56) References Cited

U.S. PATENT DOCUMENTS

| | | | |
|---|---|---|---|
| 5,521,946 | 5/1996 | Main | 375/350 |
| 5,537,113 | 7/1996 | Kawabata | 341/141 |
| 5,539,403 | 7/1996 | Tani et al. . | |
| 5,856,799 | 1/1999 | Hamasaki et al. | 341/144 |
| 5,870,047 | 2/1999 | Piesinger | 341/143 |

FOREIGN PATENT DOCUMENTS

| | | |
|---|---|---|
| 597123A1 | 5/1994 | (EP) . |
| 5335963 | 12/1993 | (JP) . |

OTHER PUBLICATIONS

European Search Report dated Aug. 11, 1999.
Technical Report of The Institute of Electronics, Information and Communication Engineers, CAS94–9, VLD94–9, DSP94–31 (1994) pp. 63–70.

*Primary Examiner*—Peguy JeanPierre
(74) *Attorney, Agent, or Firm*—Stevens, Davis, Miller & Mosher, LLP (57) ABSTRACT

To provide a D/A conversion apparatus that can minimize the increase in the amount of circuitry if the number of output levels is increased, a digital input value, input for each sampling clock, is first converted by a digital filter and a noise shaper into a word length limited digital signal with a high sampling frequency. The output of the noise shaper is mapped by a decoder to n m-valued signals a "1" at a time in a cyclic fashion progressing from one signal to the next so that the sum of the n m-valued signals becomes equal to the digital input value; thereafter, the n m-valued signals are converted by n m-valued D/A converters into corresponding analog signals which are then summed together by an analog adder to produce an analog output signal. The term "cyclic" means not only that one digital input value is mapped to the n m-valued signals a "1" at a time in a cyclic fashion progressing from one signal to the next, but also that the mapping of the present digital input value to the n m-valued signals is performed starting with the m-valued signal that immediately follows the m-valued signal to which the preceding digital input value was last mapped.

9 Claims, 7 Drawing Sheets

D/A CONVERSION APPARATUS

BACKGROUND OF THE INVENTION

1. Field of the Invention

The present invention relates to a digital to analog (D/A) conversion apparatus for converting a digital signal to an analog signal, and more particularly to an oversampling D/A conversion apparatus which performs D/A conversion using a sampling frequency higher than the sampling frequency of the digital input signal.

2. Description of the Related Art

Among D/A converters, a D/A conversion apparatus is known that utilizes a noise shaper and a 1-bit D/A converter array. A prior known D/A conversion apparatus of this type will be described with reference to FIG. 6. Techniques involved in this apparatus are disclosed in the following literature A and B.

Literature A: Japanese Patent Unexamined Publication No. 5-335963

Literature B: Technical Report of IEICE, CAS94-9

Figure 6:
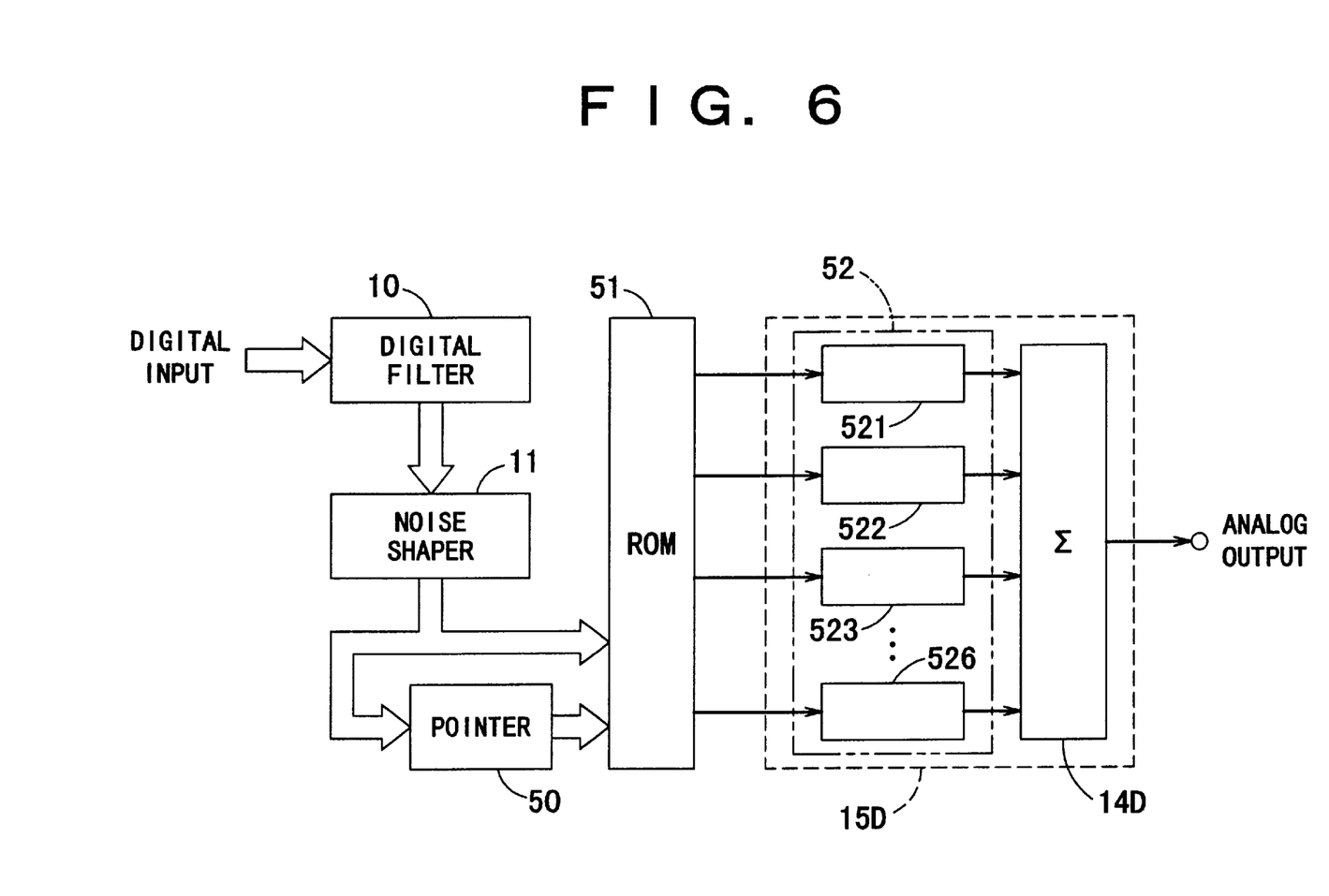
FIG. 6 is a block diagram showing one example of a prior art D/A conversion apparatus.

FIG. 6 is a block diagram showing one example of the prior known D/A conversion apparatus. In FIG. 6, a digital filter 10 is provided to increase the sampling frequency $f_s$ of the input digital signal, for example, the digital audio signal reproduced from a compact disc, by a factor of k (k is an integer). For purposes of explanation, it is assumed here k=64.

A noise shaper 11 is used for quantizing (word length limiting) the digital output signal of the digital filter 10, and for changing the frequency characteristic of noise in a controlled manner. More specifically, in this case, the frequency characteristic is changed, for example, in such a manner as to reduce the noise level at low frequencies while increasing the noise level at high frequencies. A noise shaper with a second-order characteristic is used here, its output Y for input X being expressed by equation (1) below.

$$Y = X + (1 - z^{-1}) \cdot V_q \quad \text{(Equation 1)}$$

where $V_q$: Quantization error $z^{-1}$: $\cos\theta - j\cdot\sin\theta$ j: Imaginary unit The following description assumes that the output Y represents seven (=p) levels (0 to 6).

A pointer 50 outputs a remainder of the accumulated value of the input signal. In this example, the output of the noise shaper 11 is accumulated and a remainder modulo 6 is output. Denoting the input to the pointer 50 at a given time t as $X_t$, the output $Y_t$ is given by equation (2) below.

$$Y_t = (X_{t-1} + Y_{t-1}) \bmod 6 \quad \text{(Equation 2)}$$

where $X_{t-1}$: Input one sample back $Y_{t-1}$: Output one sample back

A ROM (read only memory) 51 outputs 6-bit data in response to an address with the input signal as the low order part and the output of the pointer 50 as the high order part.

A 1-bit D/A converter array 52 consists of six (=n) identical 1-bit D/A converters 521 to 526, and converts the 6-bit data output from the ROM 51 into analog signals.

An analog adder 14D sums the six analog signals output from the 1-bit D/A converters 521 to 526, and outputs the result as an analog signal.

The 1-bit D/A converters 521 to 526 and the analog adder 14D together constitute a D/A conversion circuit 15D.

The D/A conversion apparatus of FIG. 6 employs the so-called oversampling D/A conversion configuration in which the digital filter 10 and noise shaper 11 convert the digital input signal into a signal with seven (=p) levels at a sampling frequency of $64f_s$, then the seven-level signal is converted by the pointer 50 and ROM 51 into six 1-bit signals which are further converted into an analog signal by the D/A conversion circuit 15D, thus accomplishing the digital to analog conversion with a higher sampling frequency.

Figure 7:
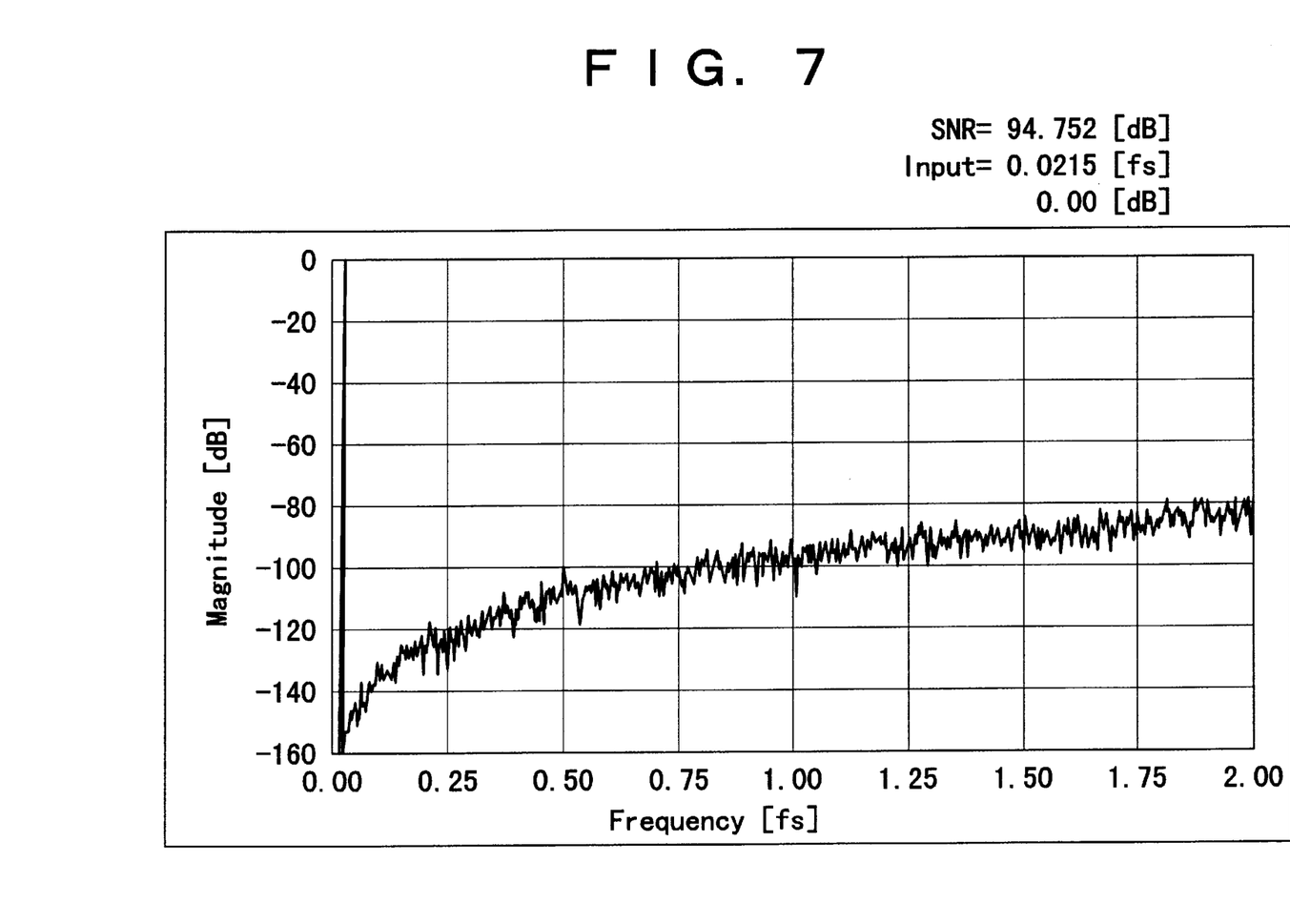
FIG. 7 is an output signal spectrum of the D/A conversion apparatus of FIG. 6, obtained by computer simulation.

FIG. 7 shows the spectrum of the output signal of the D/A conversion apparatus of FIG. 6, obtained by computer simulation assuming the use of an ideal D/A conversion circuit 15D. For simplicity, the signal is shown here in the range of 0 to $2f_s$. Although the analog signal is reconstructed from the digital signal representing only seven levels, as stated above, a dynamic range greater than 90 dB is obtained in the signal band of 0 to $f_s/2$, as shown in FIG. 7, by virtue of the shifting of the noise frequency characteristic through the noise shaper 11.

In a practical circuit, however, it is not possible to manufacture the 1-bit D/A converters 521 to 526 all identical in characteristic, but some degree of variation (relative errors) inherently occurs between their outputs, resulting in noise generation. The following describes a method in which the 1-bit D/A converters 521 to 526 are used in a cyclic fashion in order to suppress this noise.

First, the pointer 50 accumulates the seven-level signal (0 to 6) output from the noise shaper 11 of FIG. 6, and obtains a remainder modulo 6 for output. The pointer 50 thus presents six possible outputs 0 to 5.

Next, an address consisting of the input signal (the output signal of the noise shaper 11) as the low order part and the output signal of the pointer 50 as the high order part is supplied to the ROM 51, and 6-bit data is obtained. The 6-bit data represents six non-weighted 1-bit signals. Table 1 shows the relationship between the address (in decimal notation) and the data (six 1-bit signals) at this time. In Table 1, data 0 is represented by symbol . for easy viewing.

TABLE 1

| High order | Data |
|---|---|
| | Low order = 0 |
| 0 | . . . . . . |
| 1 | . . . . . . |
| 2 | . . . . . . |
| 3 | . . . . . . |
| 4 | . . . . . . |
| 5 | . . . . . . |
| | Low order = 1 |
| 0 | . . . . . 1 |
| 1 | . . . . 1 . |
| 2 | . . . 1 . . |
| 3 | . . 1 . . . |
| 4 | . 1 . . . . |
| 5 | 1 . . . . . |
| | Low order = 2 |
| 0 | . . . . 1 1 |
| 1 | . . . 1 1 . |
| 2 | . . 1 1 . . |
| 3 | . 1 1 . . . |
| 4 | 1 1 . . . . |
| 5 | 1 . . . . 1 |

TABLE 1-continued

| High order | Data |
|---|---|
| Low order = 3 | |
| 0 | . . . 1 1 1 |
| 1 | . . 1 1 1 . |
| 2 | . 1 1 1 . . |
| 3 | 1 1 1 . . . |
| 4 | 1 1 . . . 1 |
| 5 | 1 . . . 1 1 |
| Low order = 4 | |
| 0 | . . 1 1 1 1 |
| 1 | . 1 1 1 1 . |
| 2 | 1 1 1 1 . . |
| 3 | 1 1 1 . . 1 |
| 4 | 1 1 . . 1 1 |
| 5 | 1 . . 1 1 1 |
| Low order = 5 | |
| 0 | . 1 1 1 1 1 |
| 1 | 1 1 1 1 1 . |
| 2 | 1 1 1 1 . 1 |
| 3 | 1 1 1 . 1 1 |
| 4 | 1 1 . 1 1 1 |
| 5 | 1 . 1 1 1 1 |
| Low order = 6 | |
| 0 | 1 1 1 1 1 1 |
| 1 | 1 1 1 1 1 1 |
| 2 | 1 1 1 1 1 1 |
| 3 | 1 1 1 1 1 1 |
| 4 | 1 1 1 1 1 1 |
| 5 | 1 1 1 1 1 1 |

To describe Table 1, the 6-bit data contains as many is as indicated by the numeric value of the input signal, i.e., the low order part of the address, so that the sum of the bits becomes equal to the input signal. Further, the bits are shifted in a cyclic fashion to the left by the same number of bit positions as indicated by the numeric value of the output signal of the pointer 50, i.e., the high order part of the address, any overflown bits appearing from the right. When the ROM 51 is defined as shown in Table 1, data is output, for example, as shown in Table 2, for the input data at respective times.

TABLE 2

| Time | Input (Low order part of address) | Output of pointer 30 (High order part of address) | Output of ROM 51 (Data) |
|---|---|---|---|
| $t_0$ | 1 | 0 | . . . . . 1 |
| $t_1$ | 3 | 1 | . . 1 1 1 . |
| $t_2$ | 1 | 4 | . 1 . . . . |
| $t_3$ | 1 | 5 | 1 . . . . . |
| $t_4$ | 6 | 0 | 1 1 1 1 1 1 |
| $t_5$ | 4 | 0 | . . 1 1 1 1 |
| $t_6$ | 2 | 4 | 1 1 . . . . |
| $t_7$ | 2 | 0 | . . . . 1 1 |
| $t_8$ | 6 | 2 | 1 1 1 1 1 1 |
| $t_9$ | 5 | 2 | 1 1 1 1 . 1 |
| $t_{10}$ | 0 | 1 | . . . . . . |
| $t_{11}$ | 3 | 1 | . . 1 1 1 . |
| . | . | . | . |
| . | . | . | . |

As can be seen from Table 2, the data is output in such a manner that the same number of 1s as indicated by the numeric value of the input signal are shifted in a cyclic fashion through the 6-bit data. This means that there is no correlation between the numeric value of the input signal and any particular bit in the 6-bit data. This serves to reduce the in-band noise even when there are variations between the outputs of the 1-bit D/A converter array 52 to which the 6-bit data are coupled.

However, the configuration shown in FIG. 6 requires as many 1-bit D/A converters 521 to 526 as the number of output levels of the noise shaper 11 minus one. Generally, in an oversampling D/A conversion apparatus, a greater dynamic range can be obtained as the number of output levels of the noise shaper increases; therefore, if the dynamic range is to be increased, the number of 1-bit D/A converters must be increased correspondingly, resulting in a corresponding increase in the amount of circuitry.

Further, when configuring the D/A conversion apparatus as a balanced circuit, generally the balanced circuit configuration has been achieved by using two identical D/A conversion circuits and converting digital signals of opposite phases into analog signals, and by summing the analog signals with one of the signals phase-inverted. This, however, doubles the amount of circuitry, also presenting the problem of increased circuitry.

Another example relies on the use of pulse width modulation circuits to convert digital signals to analog signals. This approach does not involve increasing the amount of circuitry, but requires that the clock frequency for pulse width modulation be set extremely high, presenting the problem that modulation clock jitter has a significant effect on conversion performance, degrading the conversion performance.

SUMMARY OF THE INVENTION

A first object of the present invention is to provide a D/A conversion apparatus that can minimize the increase in the amount of circuitry if the number of output levels is increased.

A second object of the present invention is to provide a D/A conversion apparatus that can achieve a balanced circuit configuration while minimizing the increase in the amount of circuitry.

A third object of the present invention is to provide a D/A conversion apparatus that can minimize the degradation of conversion performance caused by conversion clock jitter if the number of output levels is increased.

To achieve the above objects, the present invention provides the following configuration. That is, the D/A conversion apparatus comprises: a decoder for converting a digital input signal, input for each sampling clock, into n m-valued signals each corresponding to the amplitude level of the input signal (where m is an integer not smaller than 3, and n is an integer not smaller than 2, the m value being 0, 1, 2, . . . , m−1); n m-valued D/A converters for converting the outputs of the decoder into analog signals; and an analog adder for summing the outputs of the n m-valued D/A converters.

In the above configuration, the decoder maps the digital input value to the n m-valued signals a "1" at a time in a cyclic fashion progressing from one signal to the next so that the sum of the n m-valued signals becomes equal to the digital input value. The term "cyclic" here means not only that one digital input value is mapped to the n m-valued signals a "1" at a time in a cyclic fashion progressing from one signal to the next, but also that the mapping of the present digital input value to the n m-valued signals is performed starting with the m-valued signal that immediately follows the m-valued signal to which the preceding digital input value was last mapped.

Operation of the decoder will be described using mathematical equations. Denoting the largest integer contained in numeric value x as [x], the decoder converts a digital input value $D(t_j)$ ($0 \leq D(t_j) \leq mn-n$, where $D(t_j)$ is an integer), applied at time $t_j$ corresponding to the j-th sampling clock, into the n m-valued signals $A_1(t_j)$, $A_2(t_j)$, ..., $A_n(t_j)$ ($0 \leq A_i(t_j) \leq m-1$, where i=1, 2, ..., n, and j=0, 1, 2, ...) such that any m-valued signal $A_i(t_j)$ for the digital input value $D(t_j)$ is given as $$A_i(t_j)=[\{D(t_j)+L_i(t_j)\}\div n]$$

where
i=1, 2, ..., n
j=0, 1, 2, ...

Here, the relationship between the value $L_i(t_j)$ ($0 \leq L_i(t_j) \leq m-1$, where $L_i(t_j)$ is an integer) and the value $L_i(t_{j+1})$ one sample clock after is expressed as $$L_i(t_{j+1})=(L_i(t_j)+D(t_j)) \bmod n$$

and $$L_i(t_0)=n-i \ (i=1, 2, \ldots, n)$$

is given as an initial value.

The m-valued D/A converters comprise pulse width modulation circuits for outputting pulses having pulse widths corresponding, for example, to the values of the m-valued signals.

The above configuration may be modified so that some of the n m-valued signals output from the decoder are output as inverted signals which, after being converted into analog form by the m-valued D/A converters, are summed with the other m-valued signals converted into analog form.

Further, provisions may be made so that the m-valued signals to be output as inverted signals are arranged alternately with the m-valued signals to be output as noninverted signals, in a cyclic signal mapping sequence.

As described above, according to the present invention, by using m-valued D/A converters instead of 1-bit D/A converters, a D/A conversion apparatus can be achieved that can minimize the increase in the amount of circuitry if the number of output levels is increased.

As described in relation to the prior art, in a D/A conversion apparatus using a plurality of 1-bit D/A converters, output amplitude errors between the D/A converters become a factor that will degrade the D/A conversion accuracy. This problem can be avoided by using the 1-bit D/A converters in a cyclic fashion.

Now, assuming that the output of the first m-valued D/A converter in the present invention is the sum of the outputs of (m−1) 1-bit D/A converters, the 1-bit D/A converters are denoted as $$DA_{11}, DA_{12}, DA_{13}, \ldots, DA_{1(m-1)}$$

Likewise, the second to n-th D/A converters respectively are assumed to consist of $$DA_{21}, DA_{22}, DA_{23}, \ldots, DA_{2(m-1)} \ldots DA_{n1}, DA_{n2}, DA_{n3}, \ldots, DA_{n(m-1)}$$

When mapping the digital input value, input for each sampling clock, to the respective 1-bit D/A converters, the 1-bit D/A converters are assumed to be arranged in a row in the order of $$DA_{11}, DA_{21}, \ldots, DA_{n1}, DA_{12}, \ldots, DA_{n2}, DA_{13}, \ldots, DA_{n(m-1)}$$

and signals are mapped in such a manner that the mapping of the present digital input value to the 1-bit D/A converters is performed starting with the 1-bit D/A converter that immediately follows the 1-bit D/A converter to which the preceding digital input value was last mapped. By so doing, the output amplitude errors between the 1-bit D/A converters can be suppressed as in the prior art D/A conversion apparatus. The signal mapping results are then reconverted and applied to the m-valued D/A converters.

If the above operation is described in terms of the mapping of the digital input signal to the nm-valued signals, the digital input value is mapped to the n m-valued signals a "1" at a time in a cyclic fashion progressing from one signal to the next so that the sum of the n m-valued signals becomes equal to the digital input value.

Further, according to the present invention, since the m-valued D/A converters are equal in terms of amplitude weighting and output signal component when viewed from the analog side, if phase-inverted signals are input to some of the m-valued D/A converters, and their analog outputs are phase inverted and summed with the analog outputs of the other m-valued D/A converters, a balanced circuit configuration can be achieved.

Generally, accuracy errors between opposite phases of a phase inverting adder circuit are greater than the output amplitude errors between the m-valued D/A converters fabricated with the same circuitry. Therefore, to shift the distribution of the effects of the errors from the low frequency range to the high frequency range, the signals of opposite phases should be mapped in alternating fashion in a signal cyclic mapping sequence.

According to the present invention, because of the provision of the decoder for converting the digital input into n m-valued signals and the n m-valued D/A converters for converting the decoder outputs into analog signals, highly accurate D/A conversion can be achieved without demanding high accuracy in analog circuits, and a D/A conversion apparatus can thus be realized that can minimize the increase in the amount of circuitry if the number of output levels is increased. Furthermore, the invention achieves the realization of an excellent D/A conversion apparatus that can achieve a balanced circuit configuration without entailing an increase in the amount of circuitry, by just making provisions to invert some of the signals internally.

The m-valued D/A converters are constructed using pulse width modulators, and the digital input value is D/A converted using the n m-valued D/A converters. In this configuration, the resolution of each m-valued D/A converter can be made as small as m, and therefore, the modulation clock for pulse width modulation can be made relatively low in frequency; as a result, the effect of modulation clock jitter is reduced, and a decrease in D/A conversion accuracy associated with pulse width modulation can thus be minimized.

DESCRIPTION OF THE PREFERRED EMBODIMENTS

[Embodiment 1]

Figure 1:
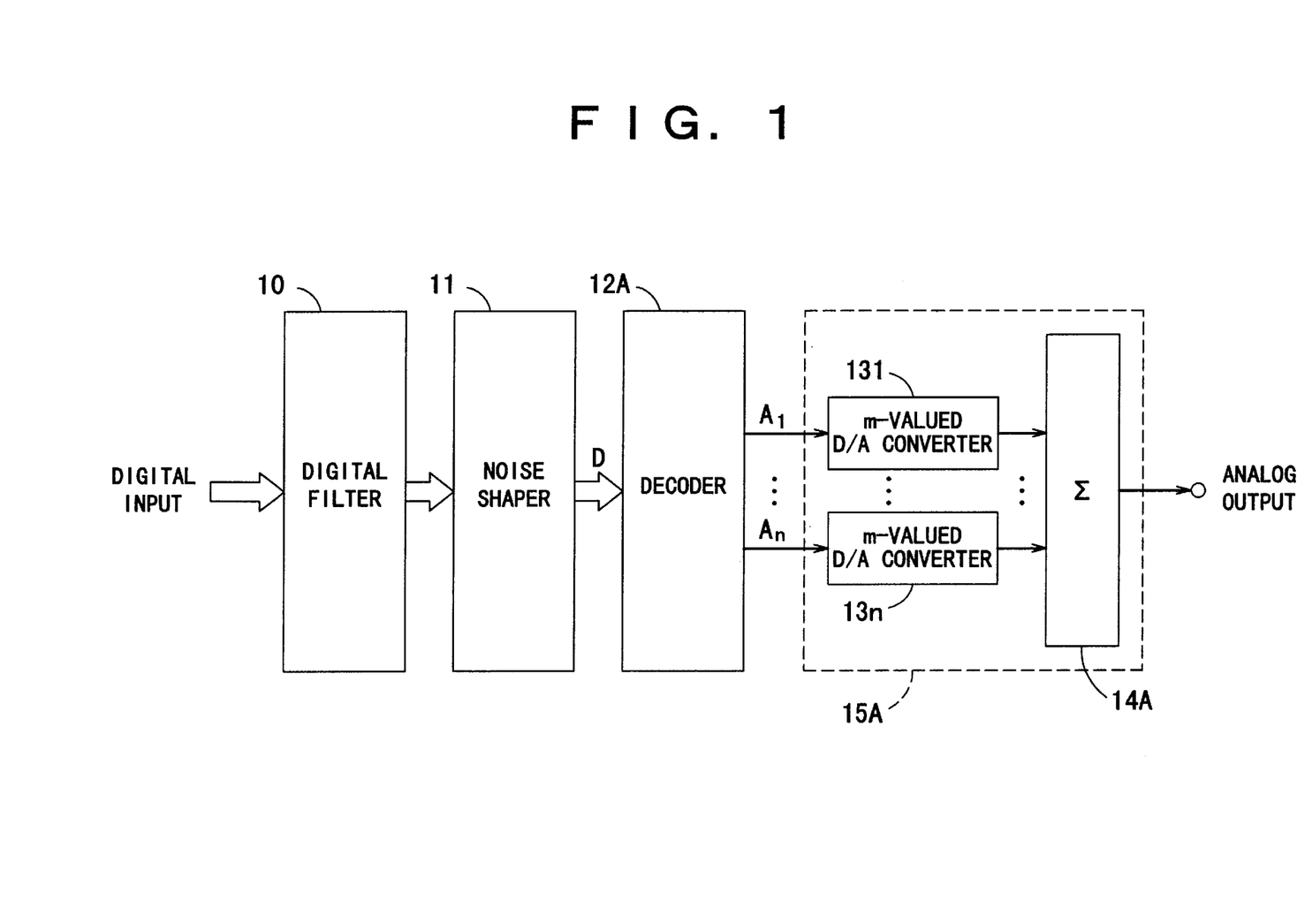
FIG. 1 is a block diagram showing a D/A conversion apparatus according to a first embodiment of the present invention.

FIG. 1 is a block diagram showing a D/A conversion apparatus according to a first embodiment of the present invention. In FIG. 1, the digital filter 10 and the noise shaper 11 are the same in configuration and function as the corresponding components shown in FIG. 6.

A decoder 12A outputs n m-valued signals, $A_1(t_j)$ to $A_n(t_j)$ $\{D(t_j)=A_1(t_j)+ \ldots +A_n(t_j)\}$, for a digital input value $D(t_j)$ output from the noise shaper 11 at time $t_j$ corresponding to the j-th sampling clock. In this case, the decoder 12A maps the digital input value $D(t_j)$ to the nm-valued signals $A_1(t_j)$ to $A_n(t_j)$ a "1" at a time in a cyclic fashion progressing from one signal to the next so that the sum of the n m-valued signals $A_1(t_j)$ to $A_n(t_j)$ becomes equal to the digital input value $D(t_j)$. The term "cyclic" here means not only that one digital input value $D(t_j)$ is mapped to the n m-valued signals $A_1(t_j)$ to $A_n(t_j)$ a "1" at a time in a cyclic fashion progressing from one signal to the next, but also that the present digital input value $D(t_j)$ is mapped to the n m-valued signals, $A_1(t_j)$ to $A_n(t_j)$, starting with the m-valued signal that immediately follows the m-valued signal to which the preceding digital input value $D(t_j-1)$ was last mapped.

Here, m is an integer not smaller than 3, and n is an integer not smaller than 2. Further, j=0, 1, 2, 3, ...

The n m-valued D/A converters 131 to 13n have identical characteristics, and convert the n m-valued signals $A_1(t_j)$ to $A_n(t_j)$ into corresponding analog signals.

An analog adder 14A sums the n analog signals output from the n m-valued D/A converters 131 to 13n and outputs the result as an analog signal. The n m-valued D/A converters 131 to 13n and the analog adder 14A together constitute a D/A conversion circuit 15A.

The mapping function of the decoder 12A will be described below using mathematical equations. That is, denoting the largest integer contained in numeric value x as [x], the decoder 12A converts the digital input value $D(t_j)$ ($0 \leq D(t_j) \leq mn-n$, where $D(t_j)$ is an integer), applied at time $t_j$ corresponding to the j-th sampling clock, into the n m-valued signals $A_1(t_j), A_2(t_j), \ldots, A_n(t_j)$ ($0 \leq A_i(t_j) \leq m-1$, where i=1, 2, ..., n, and j=0, 1, 2, ... ) such that any m-valued signal $A_i(t_j)$ for the digital input value $D(t_j)$ is given as $$A_i(t_j)=[\{D(t_j)+L_i(t_j)\} \div n]$$

where
i=1, 2, ..., n
j=0, 1, 2, ...

Here, the relationship between the value $L_i(t_j)$ ($0 \leq L_i(t_j) \leq m-1$, where $L_i(t_j)$ is an integer) and the value $L_i(t_{j+1})$ one sample clock after is expressed as $$L_i(t_{j+1})=(L_i(t_j)+D(t_j)) \bmod n$$

and $$L_i(t_0)=n-i \ (i=1, 2, \ldots, n)$$

is given as an initial value.

Figure 2:
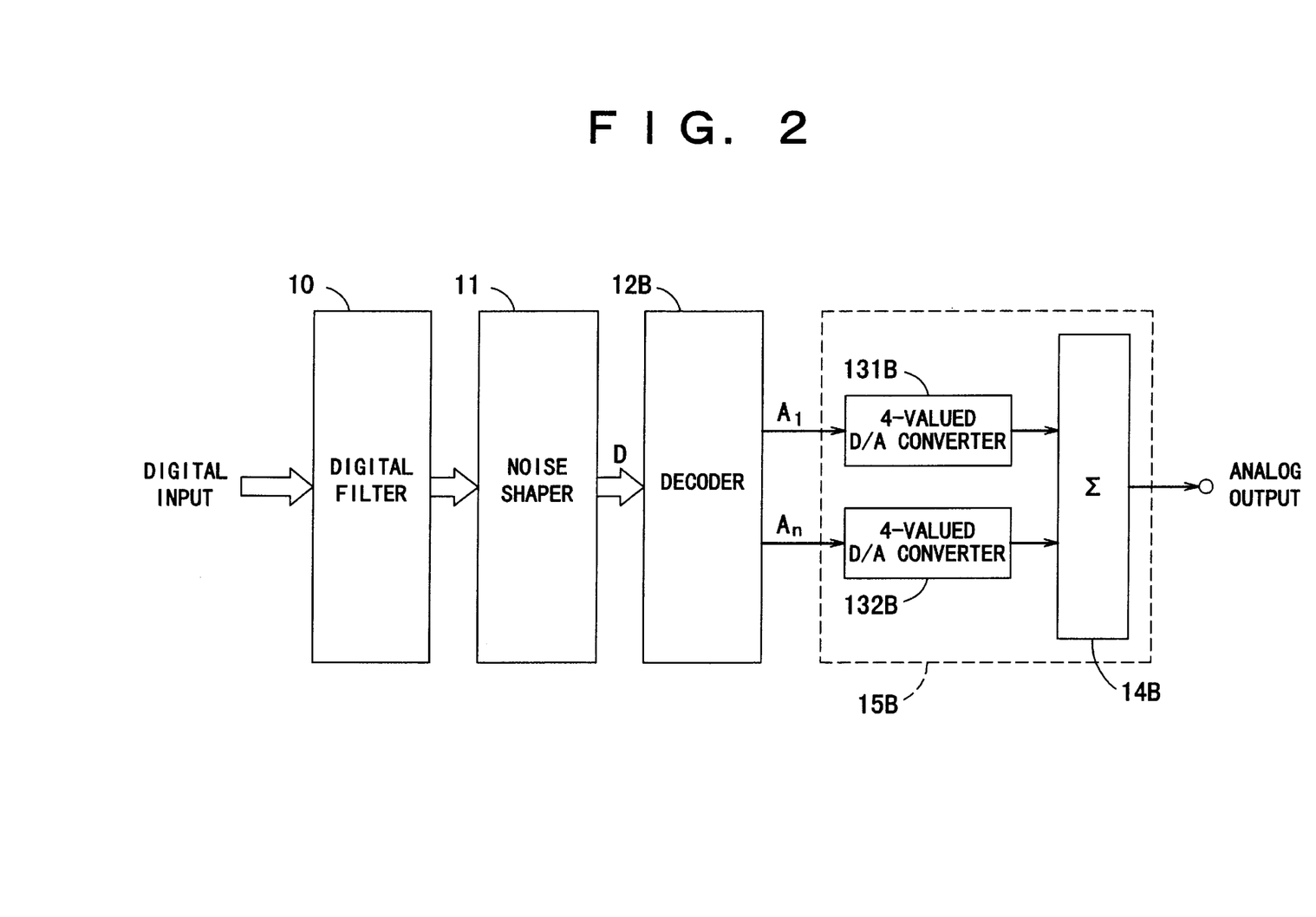
FIG. 2 is a block diagram showing the configuration of the D/A conversion apparatus in the first embodiment of the present invention specifically for the case where m=4 and n=2.

FIG. 2 is a block diagram showing the configuration of the D/A conversion apparatus of FIG. 1 for the case where m=4 and n=2. In FIG. 2, the digital filter 10 and the noise shaper 11 are the same in configuration and function as the corresponding components shown in FIG. 6.

For the digital input value $D(t_j)$ output from the noise shaper 11, a decoder 12B outputs two 4-valued signals $A_1(t_j)$ and $A_2(t_j)\{D(t_j)=A_1(t_j)+A_2(t_j)\}$, its operation being the same as that of the decoder 12A when m=4 and n=2.

The two 4-valued D/A converters 131B and 132B have identical characteristics, and convert the 4-valued signals $A_1(t_j)$ and $A_2(t_j)$ into corresponding analog signals.

An analog adder 14B sums the two analog signals output from the two 4-valued D/A converters 131B and 132B, and outputs the result as an analog signal. The 4-valued D/A converters 131B and 132B and the analog adder 14B together constitute a D/A conversion circuit 15B.

The D/A conversion apparatus of FIG. 2 employs the so-called oversampling D/A conversion configuration in which the digital filter 10 and noise shaper 11 convert the digital input value $D(t_j)$ into a signal of seven (=p) levels at a sampling frequency of $64f_s$, then the seven-level signal is converted by the decoder 12B into two 4-valued signals $A_1(t_j)$ and $A_2(t_j)$ which are further converted into an analog signal by the D/A conversion circuit 15B, thus accomplishing the digital to analog conversion with a higher sampling frequency.

Figure 3:
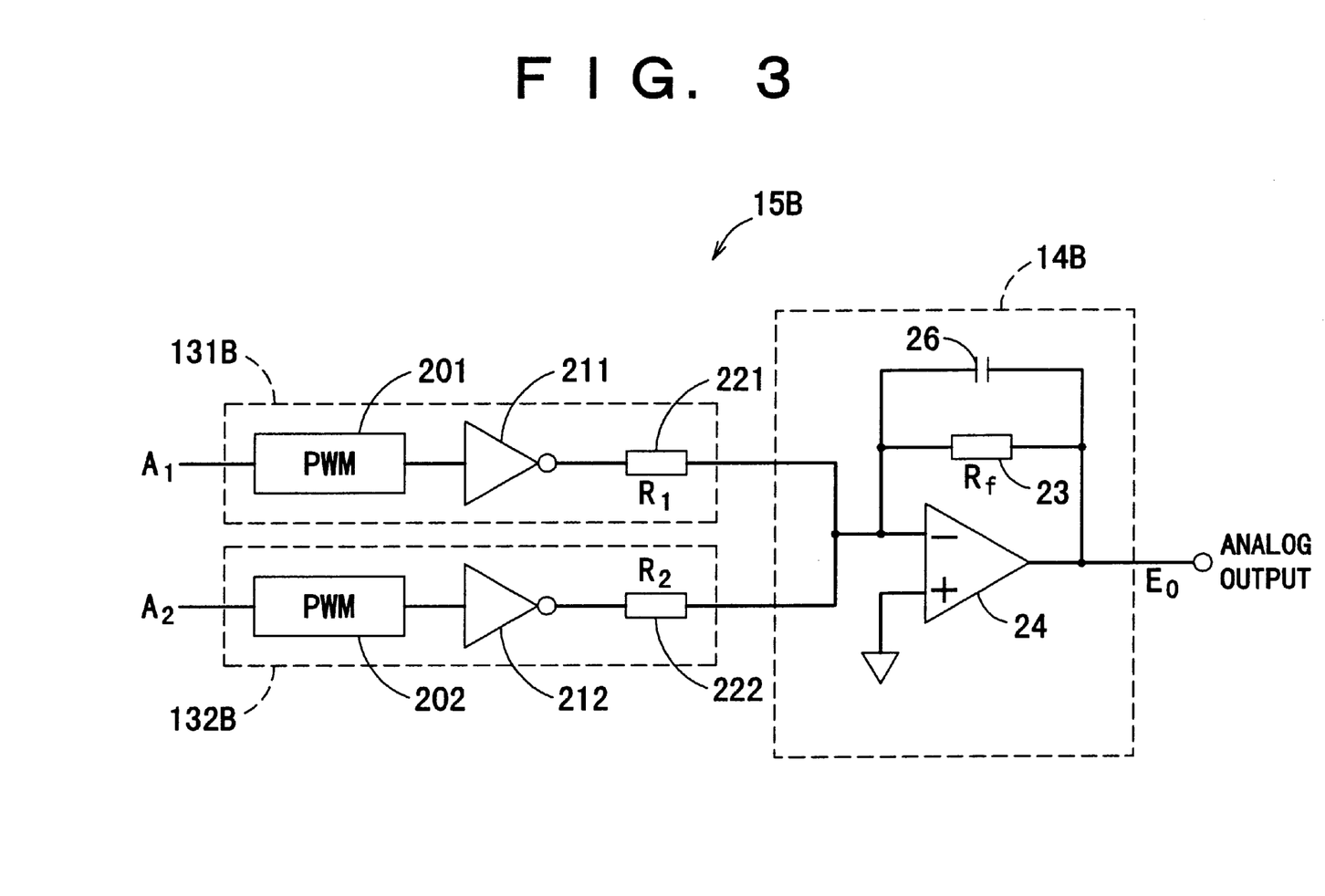
FIG. 3 is a circuit diagram showing a specific example of a D/A conversion circuit in the D/A conversion apparatus of FIG. 2.

A specific example of the D/A conversion circuit 15B of FIG. 2 is shown in FIG. 3. In FIG. 3, the 4-valued D/A converters 131B and 132B and the analog adder 14B are the same as the corresponding components shown in FIG. 2. Pulse width modulation circuits 201 and 202 convert the 4-valued input signals $A_1(t_j)$ and $A_2(t_j)$ to 1-bit signals having pulse widths corresponding to the respective input signals. Inverters 211 and 212 invert the respective signals for output. Resistors 221, 222, and 23 and a capacitor 26 are connected to an operational amplifier 24.

Operation in FIG. 3 will be described. Since the noninverting input terminal of the operational amplifier 24 is grounded, its inverting input terminal works as a virtual ground. The 4-valued signals $A_1(t_j)$ and $A_2(t_j)$ are converted by the respective pulse width modulation circuits 201 and 202 into 1-bit signals having pulse widths corresponding to the values that the respective 4-valued signals $A_1(t_j)$ and $A_2(t_j)$ take. These 1-bit signals are both coupled to the noninverting input terminal of the operational amplifier 24 through the inverters 211 and 212 and resistors 221 and 222, and further to the output terminal of the operational amplifier 24 via a parallel circuit consisting of the resistor 23 and capacitor 26. Thus, a current summer circuit comprising the resistors 221, 222, and 23 is formed, also providing the function of a low pass filter.

Here, denoting the resistance value of the resistor 221 in the 4-valued D/A converter 131B as $R_1$, the resistance value of the resistor 222 in the 4-valued D/A converter 132B as $R_2$, and the resistance value of the resistor 23 as $R_f$, the analog output voltage $E_o$ is obtained using the following equation (3). In the illustrated example, with the resistor 23 connected in parallel with the capacitor 26, the analog adder 14B also functions as a low pass filter to filter out high frequency components generated by the pulse width modulation circuits 201 and 202 and extract low frequency components only, thereby converting the signals output from the inverters 211 and 212 into a signal equivalently having 4-valued amplitudes $S_1$ and $S_2$ (for example, four values of 0, ¼, 1/2, and ¾) corresponding to the values that the respective 4-valued signals $A_1(t_j)$ and $A_2(t_j)$ take.

$$E_0 = R_f \cdot \left( \frac{S_1}{R_1} + \frac{S_2}{R_2} \right)$$

where $S_1$, $S_2$: Inverter output amplitudes

Since the 4-valued D/A converters 131B and 132B are identical in configuration, the resistance values, $R_1$ and $R_2$, of the resistors 221 and 222 are also identical, that is $$R_1 = R_2$$

It thus follows that a voltage value proportional to the sum of the input signals $(A_1(t_j)+A_2(t_j))$ is output as the analog output voltage $E_o$ which is the output voltage of the operational amplifier 24.

In a practical circuit, however, it is not possible to manufacture the resistors 221 and 222 in the 4-valued D/A converters 131B and 132B so that they are exactly the same in characteristic, but some degree of relative error inherently occurs.

Figure 4:
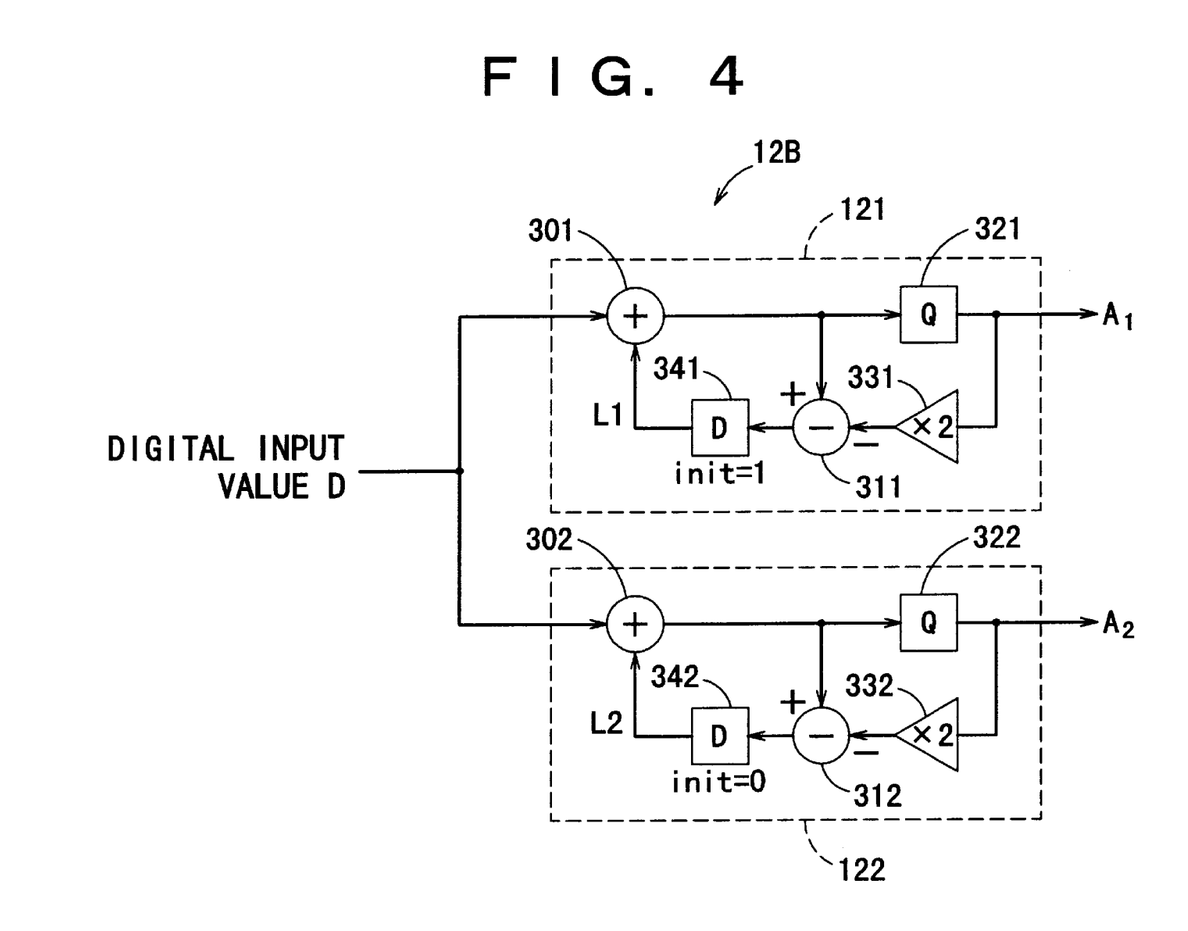
FIG. 4 is a block diagram showing a specific example of a decoder in the D/A conversion apparatus of FIG. 2.

A specific example of the decoder 12B of FIG. 2 is shown in FIG. 4. In FIG. 4, a decoder unit 121 comprises an adder 301, a subtractor 311, a quantizer 321 which outputs [X÷2] for input x, a multiplier 331 which multiplies the output of the quantizer 321 by a value 2 (=n), and a D-type flip-flop 341 which introduces a delay equivalent to one sampling clock.

Likewise, a decoder unit 122 comprises an adder 302, a subtractor 312, a quantizer 322 which outputs [X÷2] for input x, a multiplier 332 which multiplies the output of the quantizer 322 by a value 2 (=n), and a D-type flip-flop 342 which introduces a delay equivalent to one sampling clock.

The decoder 12B is constructed from the two (=n) decoder units 121 and 122. The following description assumes that the digital input value $D(t_j)$ is a seven-level signal (0 to 6).

Operation in FIG. 4 will be described. First, the D-type flip-flop 341 in the decoder unit 121 holds a 1 as an initial value unit (=$L_1(t_0)$), while the D-type flip-flop 342 in the decoder unit 122 holds a 0 as an initial value init (=$L_2(t_0)$).

Next, when the digital input value $D(t_j)$ is applied to the decoder units 121 and 122, in the digital unit 121 the digital input value $D(t_j)$ is summed with the output $L_1(t_j)$ of the D-type flip-flop 341 by the adder 301 and the result is quantized by the quantizer 321 for output. In the decoder unit 122, on the other hand, the digital input value $D(t_j)$ is summed with the output $L_2(t_j)$ of the D-type flip-flop 342 by the adder 302 and the result is quantized by the quantizer 322 for output. The relationship between the input and output of each of the decoder units 121 and 122 is expressed as $$A_1(t_j) = [\{D(t_j) + L_1(t_j)\} \div 2]$$

$$A_2(t_j) = [\{D(t_j) + L_2(t_j)\} \div 2]$$

Hence, $D(t_j) = A_1(t_j) + A_2(t_j)$.

The output of the quantizer 321 is multiplied by 2 in the multiplier 331, and then subtracted in the subtractor 311 from the input to the quantizer 321, and the result is supplied to the D-type flip-flop 341. Since its output value $L_1(t_{j+1})$ or $L_2(t_{j+1})$ is the remainder yielded by dividing the input to the quantizer 321 by 2, the output is expressed as $$L_1(t_{j+1}) = (D(t_j) + L_1(t_j)) \mod 2$$

$$L_2(t_{j+1}) = (D(t_j) + L_2(t_j)) \mod 2$$

Therefore, given the initial values $L_1(t_0)$ and $L_2(t_0)$, the value of $(L_1(t_j), L_2(t_j))$ is one or the other of two combinations, (0, 1) or (1, 0).

The above decoder outputs will be explained with reference to Table 3. As previously described in relation to the effect of the invention, the present invention maps signals in a cyclic fashion by assuming that each m-valued D/A converter is a collection of (m−1) 1-bit D/A converters and that a total of (m−1) groups of n 1-bit D/A converters are arranged in a row. Accordingly, in this embodiment, it can be assumed that two groups of three 1-bit D/A converters are arranged in a row. Table 3 shows the correspondence between the virtual signal data mapped to the 1-bit D/A converters for the digital input value $D(t_j)$ and the output signals $A_1$ and $A_2$. In Table 3, data 0 is represented by symbol . for easy viewing.

TABLE 3

| Input | 1-bit virtual data | | Output signals | |
|---|---|---|---|---|
| | | | $A_1$ | $A_2$ |
| When $(L_1, L_2) = (0, 1)$ | | | | |
| 0 | . . . | . . . | 0 | 0 |
| 1 | . . 1 | . . . | 1 | 0 |
| 2 | . . 1 | . . 1 | 1 | 1 |
| 3 | . 1 1 | . . 1 | 2 | 1 |
| 4 | . 1 1 | . 1 1 | 2 | 2 |
| 5 | 1 1 1 | . 1 1 | 3 | 2 |
| 6 | 1 1 1 | 1 1 1 | 3 | 3 |
| When $(L_1, L_2) = (1, 0)$ | | | | |
| 0 | . . . | . . . | 0 | 0 |
| 1 | . . . | . . 1 | 0 | 1 |
| 2 | . . 1 | . . 1 | 1 | 1 |
| 3 | . . 1 | . 1 1 | 1 | 2 |
| 4 | . 1 1 | . 1 1 | 2 | 2 |
| 5 | . 1 1 | 1 1 1 | 2 | 3 |
| 6 | 1 1 1 | 1 1 1 | 3 | 3 |

From the above, one can see how the digital input value $D(t_j)$ is mapped to the output signals $A_1$ and $A_2$ a "1" at a time in sequence. When the digital input value $D(t_j)$ is an even value, since the value $(L_1(t_j), L_2(t_j))$ does not change, the same table is used for the next sampling clock, and when the digital input value D is an odd value, the value $(L_1(t_j), L_2(t_j))$ changes and the table on the opposite side is used for the next sampling clock. More specifically, data are output for the input at each given time, for example, as shown in Table 4. The same input data example shown in Table 2 is used in Table 4 as an example of input data at the respective times. The positions of 1s in 1-bit virtual data shown in Table 4 may differ from the positions shown in Table 3, but this is only virtual data given for the purpose of illustrating how the bit position at which the mapping is started in the cyclic mapping operation is shifted in a cyclic fashion in accordance with the immediately preceding signal output; actual output signals are $A_1$ and $A_2$.

TABLE 4

| Time | Input (Low order part of address) | $L_1$ | $L_2$ | 1-bit virtual data | | Output signals $A_1$ | $A_2$ |
|---|---|---|---|---|---|---|---|
| $t_0$ | 1 | 1 | 0 | ..1 | ... | 1 | 0 |
| $t_1$ | 3 | 0 | 1 | .1. | .11 | 1 | 2 |
| $t_2$ | 1 | 1 | 0 | 1.. | ... | 1 | 0 |
| $t_3$ | 1 | 0 | 1 | ... | ... | 0 | 1 |
| $t_4$ | 6 | 1 | 0 | 111 | 111 | 3 | 3 |
| $t_5$ | 4 | 1 | 0 | .11 | .11 | 2 | 2 |
| $t_6$ | 2 | 1 | 0 | 1.. | ... | 1 | 1 |
| $t_7$ | 2 | 1 | 0 | ..1 | ..1 | 1 | 1 |
| $t_8$ | 6 | 1 | 0 | 111 | 111 | 3 | 3 |
| $t_9$ | 5 | 1 | 0 | 111 | 11. | 3 | 2 |
| $t_{10}$ | 0 | 0 | 1 | ... | ... | 0 | 0 |
| $t_{11}$ | 3 | 0 | 1 | .1. | .11 | 1 | 2 |
| . | . | . | . | . | . | . | . |
| . | . | . | . | . | . | . | . |

The above operation is substantially equivalent to the cyclic operation described with reference to Table 2, and output amplitude errors between the m-valued D/A converters are suppressed based on the same principle as previously described. The only difference is that unlike the 1-bit D/A converter array, the concept of position does not apply to the m-valued D/A converters but only the consideration is the numeric value.

If one looks at the data changes in the 1-bit virtual data column or the output signal column in Table 4, it will become apparent that not only is one digital input value $D(t_j)$ mapped to the two 4-valued signals $A_1(t_j)$ and $A_2(t_j)$ a "1" at a time in a cyclic fashion progressing one signal to the next, but also the mapping of the present digital input value $D(t_j)$ to the two 4-valued signals $A_1(t_j)$ and $A_2(t_j)$ is performed starting with the 4-valued signal that immediately follows the 4-valued signal to which the preceding digital input value $D(t_{j-1})$ was last mapped.

[Embodiment 2]

A second embodiment of the present invention will be described below with reference to drawing.

Figure 5:
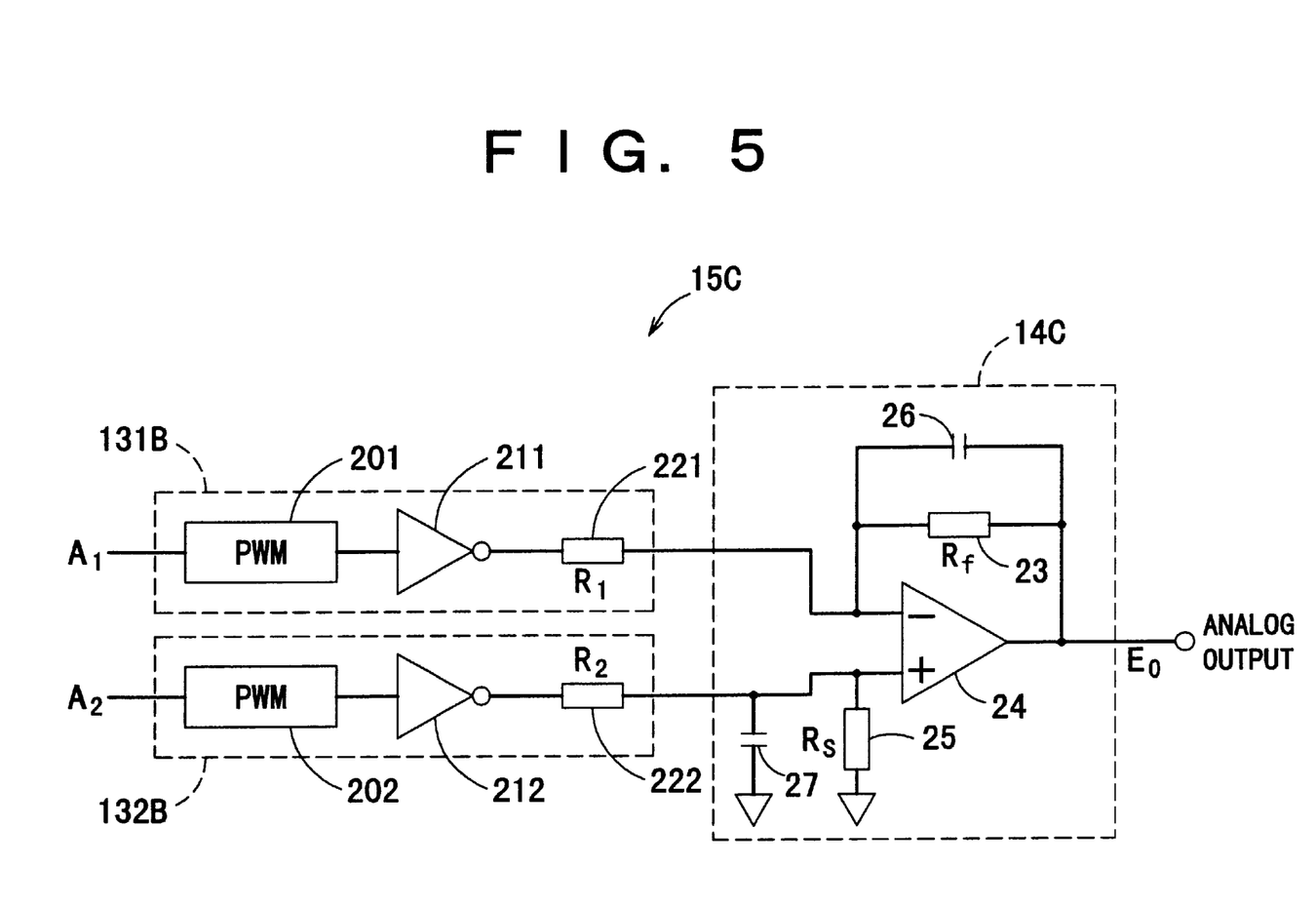
FIG. 5 is a circuit diagram showing a specific example of a D/A conversion circuit in a D/A conversion apparatus according to a second embodiment of the present invention.

FIG. 5 is a block diagram showing a D/A conversion circuit 15C which is used in place of the D/A conversion circuit 15B in the D/A conversion apparatus of the first embodiment of the present invention shown in FIG. 2. In FIG. 5, the 4-valued D/A converters 131B and 132B are the same as the corresponding components shown in FIG. 2. An analog adder 14C, unlike the one shown in FIG. 2, is configured as a phase inverting adder circuit. The pulse width modulation circuits 201 and 202 convert the 4-valued input signals $A_1(t_j)$ and /$A_2(t_j)$ into 1-bit signals having pulse widths corresponding to the values of the input signals. The 4-valued signal /$A_2(t_j)$ is the complement of the 4-valued signal $A_2(t_j)$. The inverters 211 and 212 invert the 1-bit signals for output. Resistors 221, 222, 23, and 25 and capacitors 26 and 27 are connected to the operational amplifier 24.

Operation in FIG. 5 will be described. The 4-valued input signal $A_1(t_j)$ and the inverted signal /$A_2(t_j)$ of the 4-valued input signal $A_2(t_j)$ are converted by the respective pulse width modulation circuits 201 and 202 into 1-bit signals having pulse widths corresponding to the values that the respective 4-valued input signals $A_1(t_j)$ and $A_2(t_j)$ take. The 1-bit signals are respectively coupled to the inverting input terminal and noninverting input terminal of the operational amplifier 24 via the inverters 211 and 212 and resistors 221 and 222. The signal at the inverting input terminal of the operational amplifier 24 is also coupled to the output terminal of the operational amplifier 24 via a parallel circuit consisting of the resistor 23 and capacitor 26, while the noninverting input terminal is grounded via a parallel circuit consisting of the resistor 25 and capacitor 27. That is, the resistors 221, 222, 23, and 25 and the operational amplifier 24 together form an analog phase inverting adder circuit, also providing the function of a low pass filter.

Here, denoting the resistance value of the resistor 221 in the 4-valued D/A converter 131B as $R_1$, the resistance value of the resistor 222 in the 4-valued D/A converter 132B as $R_2$, the resistance value of the resistor 23 as $R_f$, and the resistance value of the resistor 25 as $R_s$, the analog output voltage $E_o$ is obtained using the following equation (4). In the illustrated example, the resistor 23 is connected in parallel with the capacitor 26, and the resistor 25 connected in parallel with the capacitor 27; this configuration functions to filter out high frequency components generated by the pulse width modulation circuits 201 and 202 and extract low frequency components only, thereby converting the signals output from the inverters 211 and 212 into a signal equivalently having 4-valued amplitudes $S_1$ and $S_2$ (for example, four values of 0, ¼, 1/2, and ¾) corresponding to the values that the respective 4-valued signals $A_1(t_j)$ and $A_2(t_j)$ take.

$$E_0 = \frac{-R_f}{R_1} \cdot S_1 + \frac{(R_1 + R_2)}{R_1} \cdot \frac{R_s}{(R_2 + R_s)} \cdot S_2$$

where $S_1$, $S_2$: Inverter output amplitudes

Since the 4-valued D/A converters 131B and 132B are identical in configuration, the resistance values, $R_1$ and $R_2$, of the resistors 221 and 222 are also identical, that is $$R_1 = R_2$$

If the resistance values, $R_f$ and $R_s$, of the resistors 23 and 25 are also identical, it then follows that the analog output, i.e., the output of the operational amplifier 24, is proportional to $(-S_1 + S_2)$.

Since these inverter output amplitudes $-S_1$ and $S_2$ are the outputs of the inverters 211 and 212, the analog output voltage $E_o$ is proportional to the difference between the 4-valued signals $A_1(t_j)$ and $A_2(t_j)$ (that is, $A_1(t_j) - A_2(t_j)$). By applying the complement of the 4-valued signal $A_2(t_j)$, as first described, the analog output is then $A_1(t_j) + A_2(t_j)$, and the same output as that of the D/A conversion circuit of FIG. 3 can thus be obtained.

In a practical circuit, however, power sources such as the inverters 211 and 212 produce noise, which is output as in-phase noise from the 4-valued D/A converters 131B and 132B, but since their outputs are added together by the phase inverting adder circuit with one of the outputs phase-inverted, the in-phase components are canceled out, and only the signal components $(A_1(t_j) + A_2(t_j))$ are output.

The above principle is one generally known as a so-called balanced circuit, and has the characteristic that the outputs of the 4-valued D/A converters 131B and 132B, if phase-inverted and added together, are less prone to the problem of errors compared with the prior art D/A conversion method, since they are equal, including the addition errors of the phase inverting adder circuit, according to the embodiment of the present invention.

Further, if the inverted signals and noninverted signals are arranged in alternating fashion in a sequence of n signals, the noise arising due to errors is shifted to higher frequencies, and thus the effects of noise on the signal band can be minimized.

The configuration of the D/A conversion apparatus has been described above. In the above embodiments, the noise shaper 11, whose characteristic is expressed by equation (1), has been used, but any noise shaper having the number of orders, characteristics, and the number of output levels other than those described above can be used as long as it is configured to perform the intended noise shaping function. Further, the configuration of the decoder 12B shown in FIG. 4 is an example given for illustrative purposes, and it will be appreciated that the decoder configuration is not limited to the illustrated one. The circuit configuration of the D/A conversion circuit 15B or 15C also is not limited to the one shown in FIG. 3 or 5; for example, the pulse width modulation circuits 201 and 202 may be replaced by other circuit schemes that perform multi-valued D/A conversion. The only requirement here is the circuit configuration that can D/A convert the multi-valued signal train and perform analog addition of the signals.

What is claimed is:

1. A D/A conversion apparatus comprising:
   a decoder for converting a digital input value into n m-valued signals each corresponding to the amplitude level of the digital input value (where m is an integer not smaller than 3, and n is an integer not smaller than 2, the m value being 0,1, 2, ... m−1);
   n m-valued D/A converters for converting the n m-valued signals output from the decoder into analog signals at the same phase; and
   an analog adder for summing the outputs of the n m-valued D/A converters, and wherein:
   the decoder maps the digital input value to the n m-valued signals a "1" at a time in a cyclic fashion progressing from one signal to the next so that the sum of the n m-valued signals becomes equal to the digital input value.

2. A D/A conversion apparatus according to claim 1, wherein denoting the largest integer contained in numeric value x as [x], the decoder converts a digital input value $D(t_j)$ ($0 \leq D(t_j) \leq mn-n$, where $D(t_j)$ is an integer), applied at time $t_j$ corresponding to the j-th sampling clock, into the n m-valued signals $A_1(t_j), A_2(t_j), \ldots, A_n(t_j)$ ($0 \leq A_i(t_j) \leq m-1$, where i=1, 2, ..., n, and j=0, 1, 2, ... ) such that any m-valued signal $A_i(t_j)$ for the digital input value $D(t_j)$ is given as $$A_i(t_j) = [\{D(t_j) - L_i(t_j)\} \div n]$$

where
   i=1, 2, ..., n
   j=0, 1, 2, ...

and where the relationship between the value $L_i(t_j)$ ($0 \leq L_i(t_j) \leq m-1$, where $L_i(t_j)$ is an integer) and the value $L_i(t_{j+1})$ one sample clock after is expressed as $$L_i(t_{j+1}) = (L_i(t_j) + D(t_j)) \bmod n$$

and $$L_i(t_0) = n - i (i=1, 2, \ldots, n)$$

is given as an initial value.

3. A D/A conversion apparatus according to claim 2, wherein some of the n m-valued signals output from the decoder are output as inverted signals which, after being converted into analog form by the m-valued D/A converters, are summed with the other m-valued signals converted into analog form.

4. A D/A conversion apparatus according to claim 3, wherein the m-valued signals to be output as inverted signals are arranged alternately with the m-valued signals to be output as noninverted signals, in a cyclic signal mapping sequence.

5. A D/A conversion apparatus according to claim 3, wherein the m-valued D/A converters comprise pulse width modulation circuits for outputting pulses having pulse widths corresponding to the values of the m-valued signals.

6. A D/A conversion apparatus according to claim 1, wherein some of the n m-valued signals output from the decoder are output as inverted signals which, after being converted into analog form by the m-valued D/A converters, are summed with the other m-valued signals converted into analog form.

7. A D/A conversion apparatus according to claim 6, wherein the m-valued signals to be output as inverted signals are arranged alternately with the m-valued signals to be output as noninverted signals, in a cyclic signal mapping sequence.

8. A D/A conversion apparatus according to claim 1, wherein the m-valued D/A converters comprise pulse width modulation circuits for outputting pulses having pulse widths corresponding to the values of the m-valued signals.

9. A D/A conversion apparatus comprising:
   a decoder for converting a digital input value into n m-valued signals each corresponding to the amplitude level of the digital input value (where m is an integer not smaller than 3, and n is an integer not smaller than 2, the m value being 0, 1, 2, ... m−1);
   n m-valued D/A converters for converting the n m-valued signals output from the decoder, into analog signals at the same phase; and
   an analog adder for summing the analog signals output from the n m-valued D/A converters, wherein:
   each of said n m-valued D/A converters comprises a collection of (m−1) 1-bit D/A converters, and a total of (m−1) groups of n 1-bit D/A converters, one each selected from each of n collections corresponding to the n m-valued D/A converters, which are arranged in a row, and
   the decoder maps the digital input value to each of the n 1-bit D/A converters so that the m-valued signals cycle through the 1-bit D/A converters arranged in a row so that the sum of the n m-valued signals becomes equal to the digital input value.

* * * * *